United States Patent
Kim et al.

(10) Patent No.: US 7,974,139 B2
(45) Date of Patent: Jul. 5, 2011

(54) NON-VOLATILE MEMORY GENERATING DIFFERENT READ VOLTAGES

(75) Inventors: Soon-young Kim, Hwaseong-si (KR); Young-joon Choi, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 347 days.

(21) Appl. No.: 12/277,337

(22) Filed: Nov. 25, 2008

(65) Prior Publication Data

US 2009/0138652 A1 May 28, 2009

(30) Foreign Application Priority Data

Nov. 28, 2007 (KR) .................. 10-2007-0122166

(51) Int. Cl.
*G11C 5/14* (2006.01)
(52) U.S. Cl. .................. 365/189.09; 365/185.18
(58) Field of Classification Search ............ 365/189.09, 365/185.18
See application file for complete search history.

(56) References Cited

U.S. PATENT DOCUMENTS

| | | | | |
|---|---|---|---|---|
| 5,084,843 A | * | 1/1992 | Mitsuishi et al. | ............ 365/218 |
| 6,493,260 B2 | | 12/2002 | Micheloni et al. | |
| 2006/0215450 A1 | | 9/2006 | Honma et al. | |
| 2007/0047299 A1 | | 3/2007 | Bovino et al. | |

FOREIGN PATENT DOCUMENTS

| | | |
|---|---|---|
| JP | 2005-115982 | 4/2005 |
| KR | 1020050098838 A | 10/2005 |
| KR | 1020070011470 A | 1/2007 |
| KR | 1020070024702 A | 2/2007 |

* cited by examiner

*Primary Examiner* — Son T Dinh
*Assistant Examiner* — Nam T Nguyen
(74) *Attorney, Agent, or Firm* — Volentine & Whitt, PLLC

(57) ABSTRACT

In one aspect, a non-volatile memory is provided which includes a plurality of m-bit non-volatile memory cells and a plurality of n-bit non-volatile memory cells, where $1 \leq m < n$, and a voltage generator which generates a first read voltage applied to non-selected m-bit non-volatile memory cells and a second read voltage applied to non-selected n-bit non-volatile memory cells, wherein the first read voltage is less than the second read voltage.

20 Claims, 10 Drawing Sheets

NON-VOLATILE MEMORY GENERATING DIFFERENT READ VOLTAGES

PRIORITY CLAIM

A claim of priority is made to Korean Patent Application No. 10-2007-0122166, filed Nov. 28, 2007, the entirety of which is incorporated herein by reference.

SUMMARY

The present invention generally relates to memory devices and memory systems. More particularly, the present invention relates to memory devices and systems employing two or more types of non-volatile memory cells, for example, single level memory cells (SLC) and multilevel memory cells (MLC). One non-limiting examples of memory systems to which the present invention relates include solid state drives (SSDs), embedded flash drives, and NAND flash memories.

An SSD, for example, is a data storage device that typically emulates a conventional hard disk drive (HDD), thus easily replacing the HDD in most applications. In contrast to the rotating disk medium of an HDD, an SSD utilizes solid state memory to store data. With no moving parts, an SSD largely eliminates seek time, latency and other electromechanical delays and failures associated with a conventional HDD.

An SSD is commonly composed of either NAND flash (non-volatile) or SDRAM (volatile).

SSDs based on volatile memory such as SDRAM are characterized by fast data access and are used primarily to accelerate applications that would otherwise be held back by the latency of disk drives. The volatile memory of the DRAM-based SSDs typically requires the inclusion of an internal battery and a backup disk system to ensure data persistence. If power is lost, the battery maintains power for sufficient duration of copy data from the SDRAM to the backup disk system. Upon restoration of power, data is copied back from the backup disk to SDRAM, at which time the SSD resumes normal operations.

However, most SSD manufacturers use non-volatile flash memory to create more rugged and compact alternatives to DRAM-based SSDs. These flash memory-based SSDs, also known as flash drives, do not require batteries, allowing makers to more easily replicate standard hard disk drives. In addition, non-volatile flash SSDs retain memory during power loss.

As is well know in the art, single-level cell (SLC) flash is capable of storing one bit per memory cell, while multi-level cell (MLC) flash is capable of storing two or more bits per memory cell. As such, in order to increase capacity, flash SSDs may utilize multi-level cell (MLC) memory banks. However, flash SSDs generally suffer from relatively slow random write speeds, and this operational drawback is further exasperated with relatively slow speeds of MLC flash. As such, it has been suggested to equip SSDs with two types of flash storage media—lower capacity SLC memory banks and higher capacity MLC memory banks. With such a configuration, frequently used data (e.g., directory and/or log information) can be stored in the faster SLC banks, while less frequently used data (e.g., music files, images, etc.) can be stored in the slower MLC banks.

According to an aspect of the present invention, a non-volatile memory is provided which includes a plurality of m-bit non-volatile memory cells and a plurality of n-bit non-volatile memory cells, where $1 \leq m < n$, and a voltage generator which generates a first read voltage applied to non-selected m-bit non-volatile memory cells and a second read voltage applied to non-selected n-bit non-volatile memory cells, wherein the first read voltage is less than the second read voltage.

According to another aspect of the present invention, a solid state drive (SSD) is provided which includes a SSD controller and an SSD memory. The SSD memory includes a plurality of m-bit non-volatile memory cells and a plurality of n-bit non-volatile memory cells, where $1 \leq m < n$, and a voltage generator which generates a first read voltage applied to non-selected m-bit non-volatile memory cells and a second read voltage applied to non-selected n-bit non-volatile memory cells, wherein the first read voltage is less than the second maximum read voltage.

According to yet another aspect of the present invention, a computer system is provided which includes a central processing unit, a working memory, and a non-volatile memory. The non-volatile memory includes a plurality of m-bit non-volatile memory cells and a plurality of n-bit non-volatile memory cells, where $1 \leq m < n$, and a voltage generator which generates a first read voltage applied to non-selected m-bit non-volatile memory cells and a second read voltage applied to non-selected n-bit non-volatile memory cells, wherein the first read voltage is less than the second maximum read voltage.

According to still another aspect of the present invention, a method of operating a non-volatile memory is provided which includes applying a first maximum read voltage to non-selected m-bit non-volatile memory cells of the non-volatile memory and a second maximum read voltage to non-selected n-bit non-volatile memory cells of the non-volatile memory, wherein where $1 \leq m < n$, and the first maximum read voltage is less than the second maximum read voltage.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF EMBODIMENTS

The present invention will now be described by way of preferred, but non-limiting, embodiments of the invention. It is emphasized here that the invention is not limited by the exemplary embodiments described below, and that instead the scope of the invention is delimited by the appended claims.

As is traditional in the field of the present invention, the embodiments are described with reference to functional block diagrams. It will be understood that each functional block is physically implemented by programmable and/or non-programmable electronic circuits, such as semiconductor integrated circuits. Further, the functionality of one or more blocks may be physically combined into circuit blocks of greater complexity. Likewise, the functionality of a single block may be physically divided into two or more separate circuit blocks of lesser complexity.

In non-volatile memory devices, such as NAND flash memory devices, a read operation is carried out by applying a read voltage "Vread" to non-selected word lines of a memory cell array. The read voltage Vread exceeds the highest threshold voltage distribution of the programmed memory cells, thus placing the memory cells of the non-selected word lines in a conductive state.

Figure 1A:
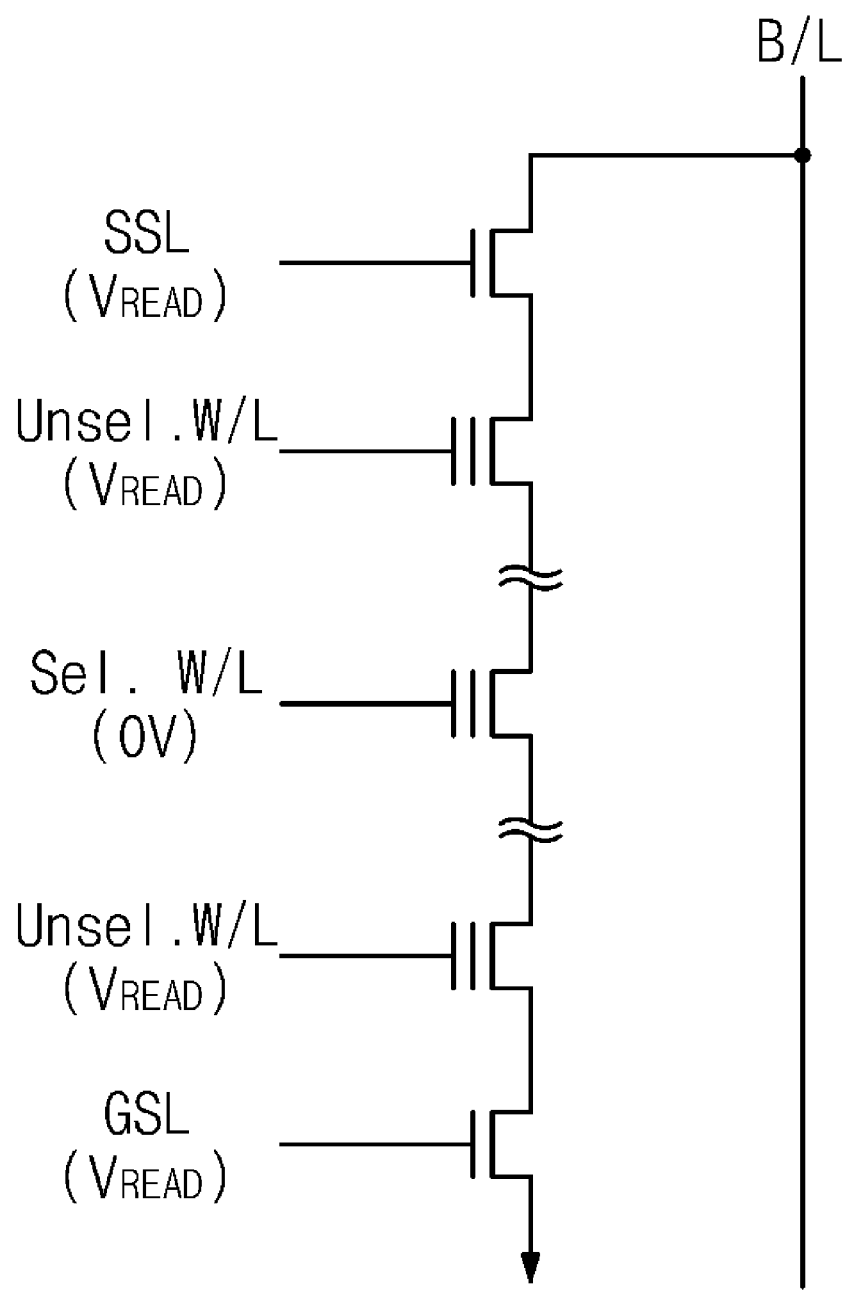
FIGS. 1A and 1B illustrate NAND flash strings for use in describing a read operation of a non-volatile memory device.
Figure 1B:
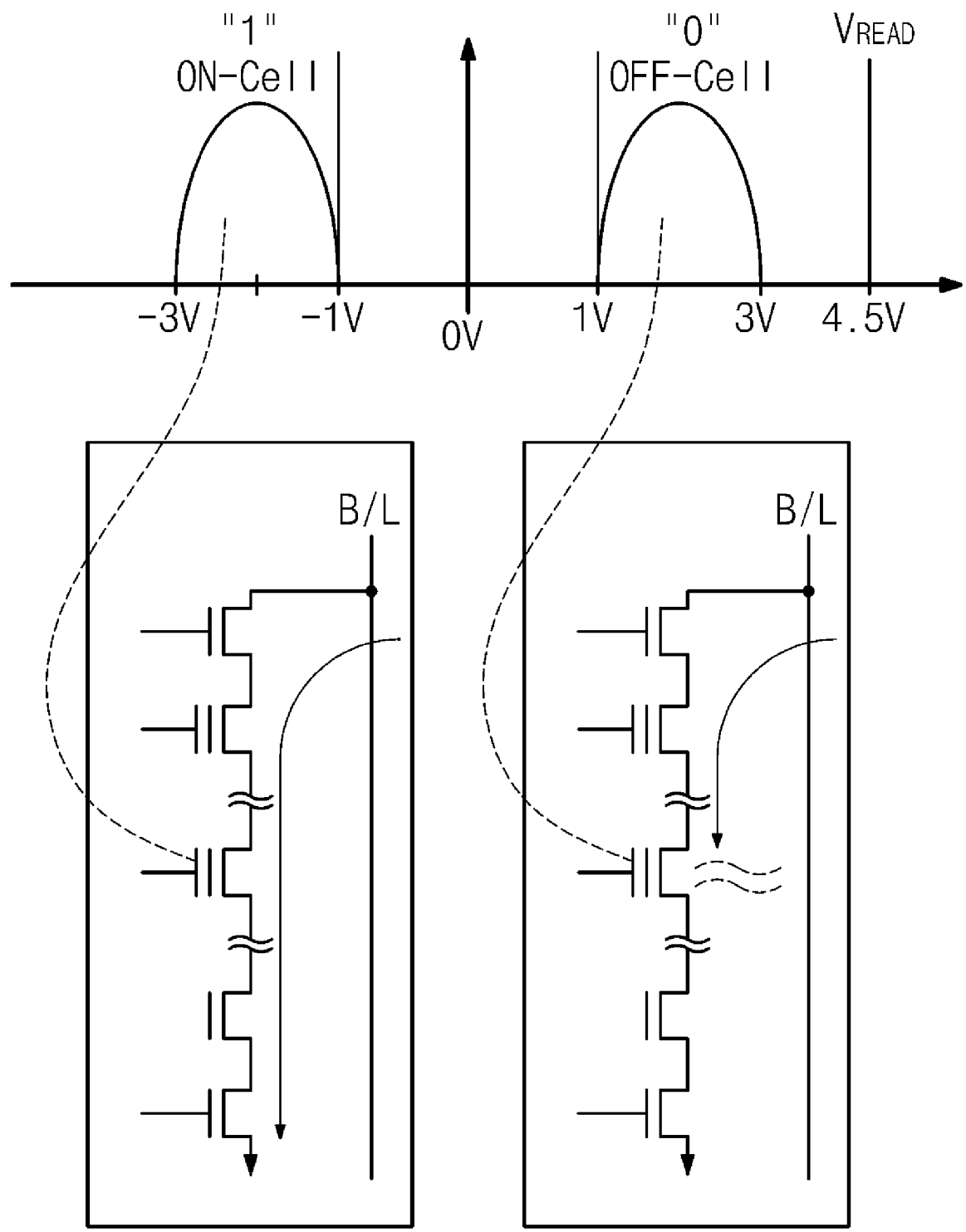

Reference is made to the examples illustrated in FIGS. 1A and 1B. In particular, FIG. 1A illustrates a NAND string including a plurality of non-volatile memory cells gated to respective word lines WL, and string select and ground select transistors gated to a string select line SSL and ground select line GSL, respectively. As shown, the non-volatile memory cells are connected in series with a bit line BL. In a read operation, the string select signal SSL and ground select line GSL are set to Vread. Further, the read operation typically occurs one word line at a time, and accordingly, one word line (Sel. WL) is selected per memory block for each read operation. In this example, the selected word line (Sel. WL) is set to 0 v, while the remaining unselected word lines WL receive the read voltage Vread. Referring to FIG. 1B, the read voltage Vread exceeds the "1" and "0" threshold voltage distributions of the cell transistors. Therefore, the cell transistors coupled to the non-selected word lines become conductive. On the other hand, the 0 v voltage applied to the selected word line falls between the threshold voltage distributions of the "1" and "0" cell transistors. As such, only the "1" cell transistors connected to the selected word line become conductive, whereas the remaining cell transistors of the selected word line are nonconductive. The result is a voltage difference among the bit lines BL of the memory block.

FIG. 1B described above shows the example of a single level cell (SLC) memory in which each cell stores a single bit of data. In the case of a multilevel cell (MLC) memory (in which multi-bit data is stored utilizing three or more threshold voltage distributions), the read operation is similarly carried out in that a read voltage Vread (which exceeds the highest threshold voltage distribution of the cells) is applied to all non-selected word lines WL of the memory block.

In non-volatile memory systems employing both single level cells (SLC) and multilevel cells (MLC), the read voltage Vread is generated at a voltage which exceeds the highest threshold voltage distribution of the SLC memory cells and the highest threshold voltage distribution of the MLC memory cells. In a read operation, this read voltage Vread is then applied to non-selected word lines of the SLC and MLC memory cells.

Generally, however, the highest threshold voltage distribution of the MLC memory cells is greater then the highest threshold voltage distribution of the SLC memory cells. As such, the read voltage Vread is dictated by the highest threshold voltage distribution of the MLC memory cells. As a result, the read voltage Vread far exceeds the highest threshold voltage distribution of the SLC memory cells. The overly excessive read voltage Vread can cause a read disturbance effect in the SLC memory cells in which undesired programming of the SLC memory cells occurs, which in turn can adversely impact the threshold voltage distributions of the programmed SLC memory cells.

The various embodiment described below are at least partially characterized by the provision of a non-volatile memory which includes both m-bit non-volatile memory cells and n-bit non-volatile memory cells, where $1 \leq m < n$. For example, the m-bit non-volatile memory cells may be SLC memory cells (m=1), and the n-bit non-volatile memory cells may be MLC memory cells (n=2 or more). A voltage generator is provided which generates a first read voltage applied to non-selected m-bit non-volatile memory cells, and a second read voltage applied to non-selected n-bit non-volatile memory cells, where the first read voltage is less than the second read voltage. As such, the voltage differential is reduced between the highest threshold voltage distribution of the m-bit memory cells and the read voltage applied to the m-bit memory cells. As a result, read disturbance in the m-bit memory cells may be reduced.

The different read voltages are referred to herein as Vread-high which is applied to the non-selected n-bit memory cells, and Vread-low which is applied to the m-bit memory cells.

Figure 2:
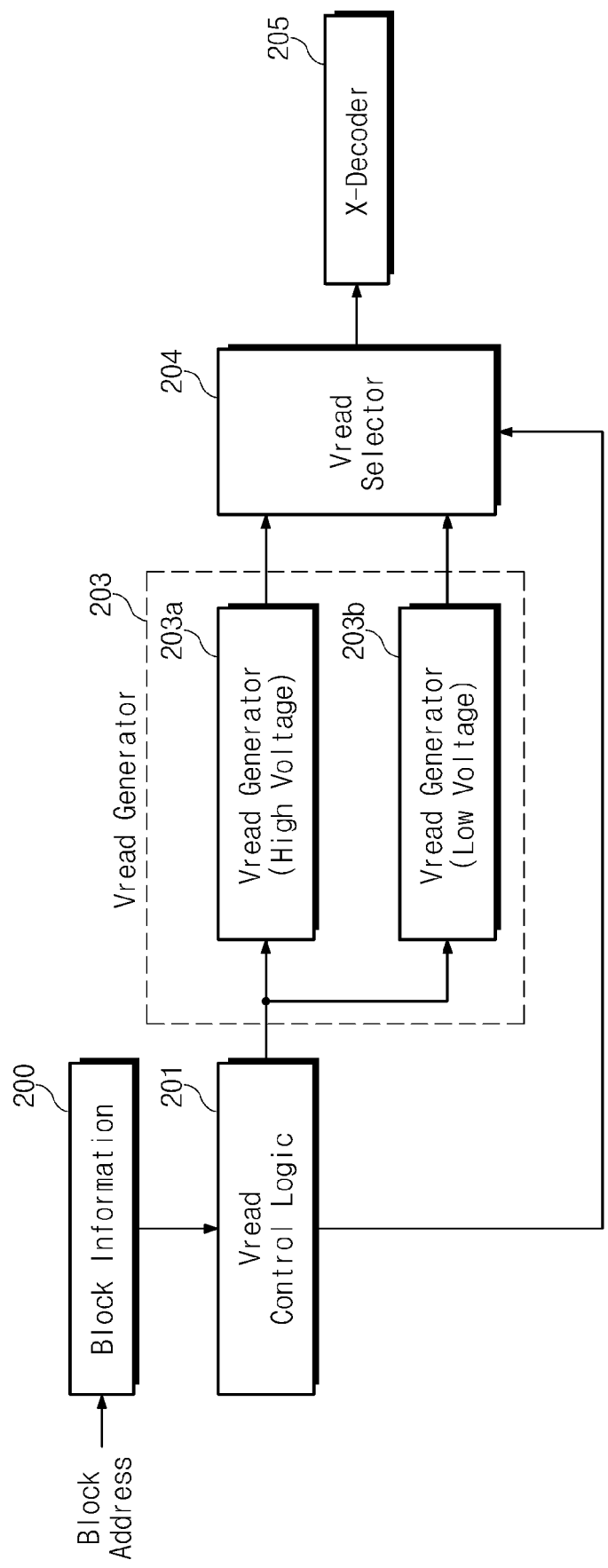
FIGS. 2, 3 and 4 are block diagrams for describing a non-volatile memory devices according to embodiments of the present invention.

The selective application of Vread-high and Vread-low to non-selected word lines may, for example, correspond to block information contained in a read address associated with the read operation. FIG. 2 illustrates such an embodiment in simplified block diagram format. As will be understood, the read address includes a block address which identifies the memory block of the memory cells to be read. As shown in FIG. 2, the block information 200 of the block address is applied to Vread control logic 201. The Vread control logic 201 activates a read generator 203 which includes a Vread-high voltage generator 203a and a Vread-low voltage generator 203b. As their names suggest, the Vread-high voltage generator 203a generates a relatively high read voltage (Vread-high), and the Vread-low voltage generator generates 203b generates a relatively low read voltage (Vread-low). The thus generated Vread-high and Vread-low are applied to a Vread selector 204. The Vread control logic 201 is programmed to control the Vread selector 204 to output one of Vread-high and V-read low. In particular, if the memory block denoted by the block information 200 contains n-bit memory cells (e.g., MLC memory cells), then the Vread control logic 201 controls the Vread selector 204 to output Vread-high. In this manner, Vread-high is supplied to an X-decoder circuit 205, which in turn applies Vread-high to non-selected word lines of the addressed memory block. In contrast, if the memory block denoted by the block information 200 contains m-bit memory cells (e.g., SLC memory cells), then the Vread control logic 201 controls the Vread selector 204 to output Vread-low. As such, Vread-low is supplied to an X-decoder circuit 205, which in turn applies Vread-low to non-selected word lines of the addressed memory block.

Figure 3:
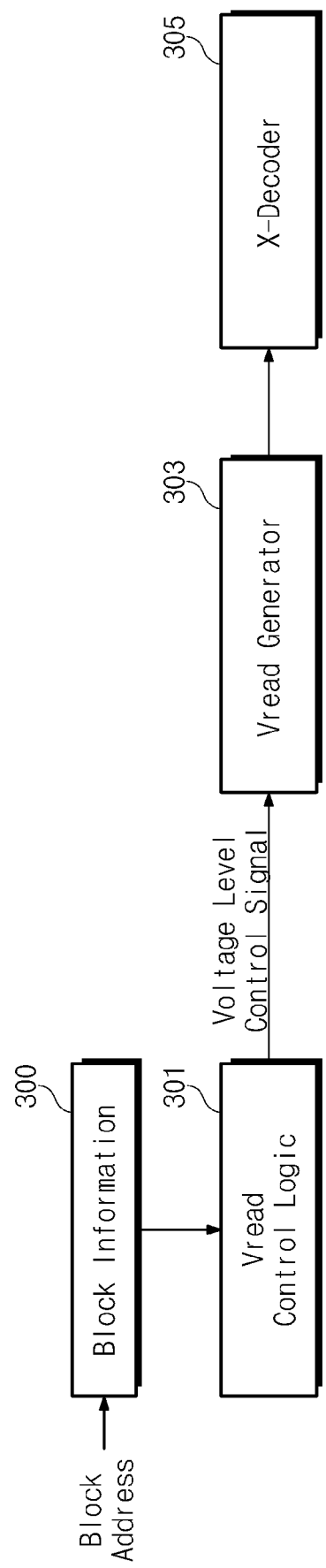

FIG. 3 illustrates another example in which block information is utilized to selectively generate Vread-high and Vread-low. Here, a Vread control logic 301 is responsive to block information 300 to generate a voltage level control signal. A Vread generator 303 is responsive to the voltage level control signal to generate either a voltage Vread-high or a voltage Vread-low, and the thus generated voltage is applied to an X-decoder 305. For example, if the memory block denoted by the block information 300 contains n-bit memory cells (e.g., MLC memory cells), then the Vread control logic 301 controls the Vread generator 303 to output Vread-high. In this manner, Vread-high is supplied to an X-decoder circuit 305, which in turn applies Vread-high to non-selected word lines of the addressed memory block. In contrast, if the memory block denoted by the block information 300 contains m-bit memory cells (e.g., SLC memory cells), then the Vread control logic 301 controls the Vread generator 303 to output Vread-low. As such, Vread-low is supplied to the X-decoder circuit 305, which in turn applies Vread-low to non-selected word lines of the addressed memory block.

Figure 4:
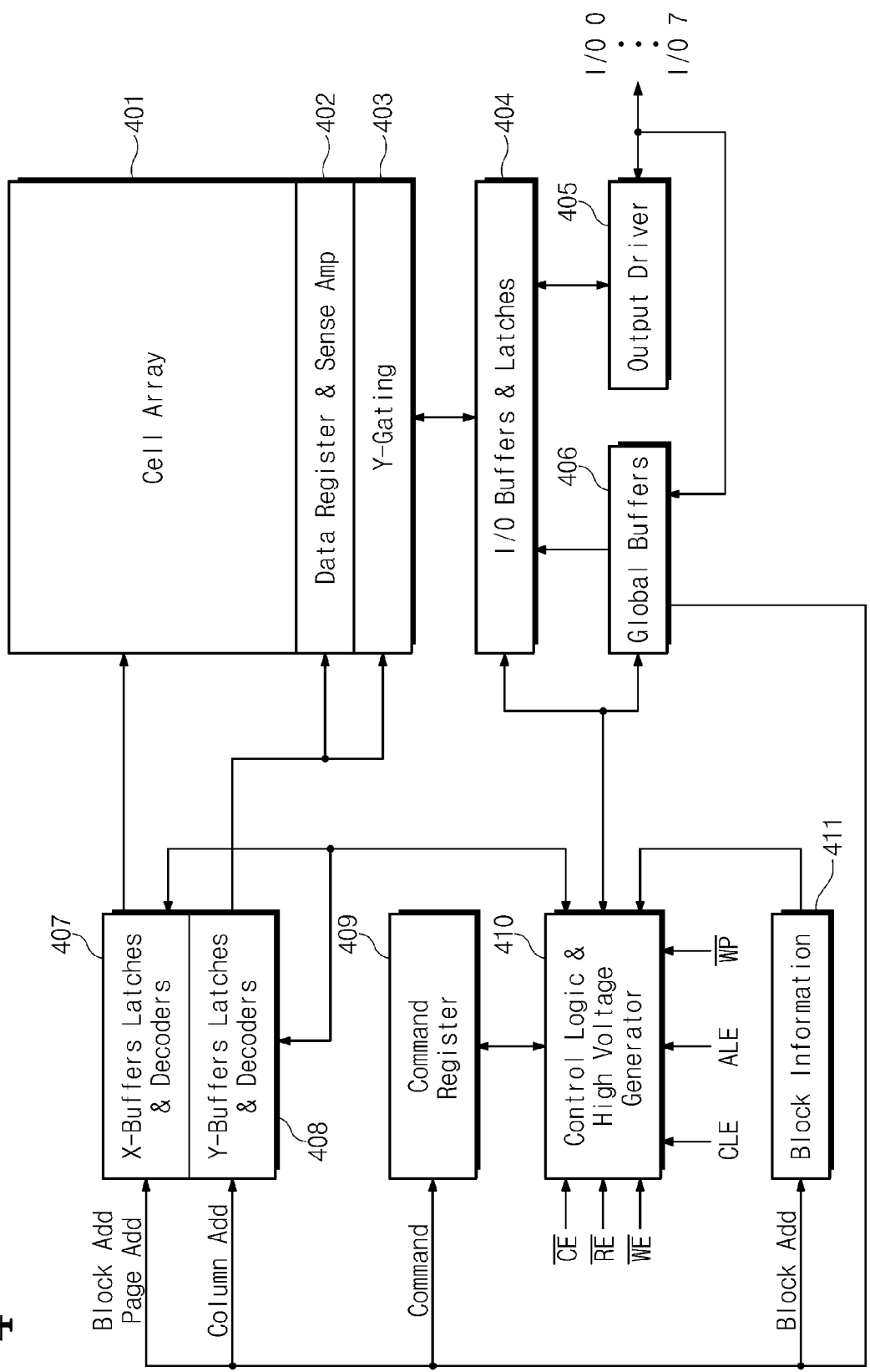

FIG. 4 illustrates a more detailed block diagram of a memory device according to an embodiment of the present invention. As shown, the memory device of this example includes a memory cell array 401, a data register & sense amplifier circuit 402, a Y-gating circuit 403, input/output (I/O) buffers and latches 404 (herein below "I/O buffer 404"), an output driver 405, global buffers 406, X-buffers, latches and decoders 407 (herein below "X-decoder 407"), Y-buffers, latches and decoders 408 (herein below "Y-decoder 408"), a command register 409, control logic and high voltage generator 410, and block information 411.

The memory cell array 401 includes blocks of m-bit non-volatile memory cells and blocks of n-bit non-volatile memory cells, where $1 \leq m < n$. For example, the m-bit non-volatile memory cells may be SLC memory cells (m=1), and the n-bit non-volatile memory cells may be MLC memory cells (n=2 or more). Further, the memory cells may be NAND flash memory cells such as those generally depicted in FIGS. 1 and 1A.

The Y-decoder is responsive to column addresses to control the data register and sense amplifier 402 and the Y-gating circuit 403. Generally, the data register and sense amplifier 402 is made up of circuitry utilized, for example, to temporarily input data and sense output data during write and read operations, and the Y-gating circuit 403 controls access to addressed bit lines (columns) of the memory cell array 401.

The X-decoder 407 is responsive to block and page addresses to apply control voltages to selected and non-selected word lines (rows) of the memory cell array 401. For example, in a read or read verify operation, the X-decoder 407 applies Vread-high or Vread-low to non-selected word lines of an addressed block of the memory cell array 401.

The I/O buffers and latches 404, global buffers 406 and output driver 405 function in a well-known manner to transmitted and receive data, addresses and commands via external circuits, such as the illustrated input/output ports I/O 0:7.

The control logic and high voltage generator 410 is responsive to commands received via the command register 409 to control an overall operation of the memory device, namely, to control read, read verify and write operations. These operations are well-understood by those skilled in the art, and a detailed description thereof is omitted here for brevity.

Block information 111 is extracted or determined from the read block address, and supplied to the control logic and high voltage generator 410. The control logic and high voltage generator 410 may, for example, include components such as those illustrated in previously described FIG. 2 or FIG. 3. In the case of FIG. 2, as described above, the block information is applied to the Vread control logic 201, and the Vread control logic 201 activates the read generator 203 which includes the Vread-high voltage generator 203a and the Vread-low voltage generator 203b. The Vread-high voltage generator 203a generates the high read voltage (Vread-high), and the Vread-low voltage generator generates 203b generates the low read voltage (Vread-low). The Vread control logic 201 is programmed to control the Vread selector 204 to output one of Vread-high and V-read low. In particular, if the memory block denoted by the block information contains n-bit memory cells (e.g., MLC memory cells), then the Vread control logic 201 controls the Vread selector 204 to output Vread-high. In this manner, Vread-high is supplied to an X-decoder 407 (FIG. 4), which in turn applies Vread-high to non-selected word lines of the addressed memory block of the memory cell array 401 (FIG. 4). In contrast, if the memory block denoted by the block information contains m-bit memory cells (e.g., SLC memory cells), then the Vread control logic 201 controls the Vread selector 204 to output Vread-low. As such, Vread-low is supplied to an X-decoder 407 (FIG. 4), which in turn applies Vread-low to non-selected word lines of the addressed memory block of the memory cell array 401 (FIG. 4).

In the case where the configuration of FIG. 3 is implemented within the control logic and high voltage generator 410 (FIG. 4), the Vread control logic 301 is responsive to the block information to generate the voltage level control signal to control the Vread generator 303 to generate either the voltage Vread-high or the voltage Vread-low, and the thus generated voltage is applied to an X-decoder 407 (FIG. 4). For example, if the memory block denoted by the block information contains n-bit memory cells (e.g., MLC memory cells), then the Vread control logic 301 controls the Vread generator 202 to output Vread-high. In this manner, Vread-high is supplied to an X-decoder circuit 407 (FIG. 4), which in turn applies Vread-high to non-selected word lines of the addressed memory block of the memory cell array 401 (FIG. 4). In contrast, if the memory block denoted by the block information contains m-bit memory cells (e.g., SLC memory cells), then the Vread control logic 301 controls the Vread generator 303 to output Vread-low. As such, Vread-low is supplied to the X-decoder circuit 407 (FIG. 4), which in turn applies Vread-low to non-selected word lines of the addressed memory block of the memory cell array 401 (FIG. 4).

In the embodiments described above in connection with FIGS. 2 through 4, the read voltage Vread is determined according to the memory block address during a read or read verify operation. However, the invention is not limited in this respect. For example, the read voltage Vread may instead be determined according to an externally received command. This example is described in more detail below with reference to FIGS. 5-6.

Figure 5:
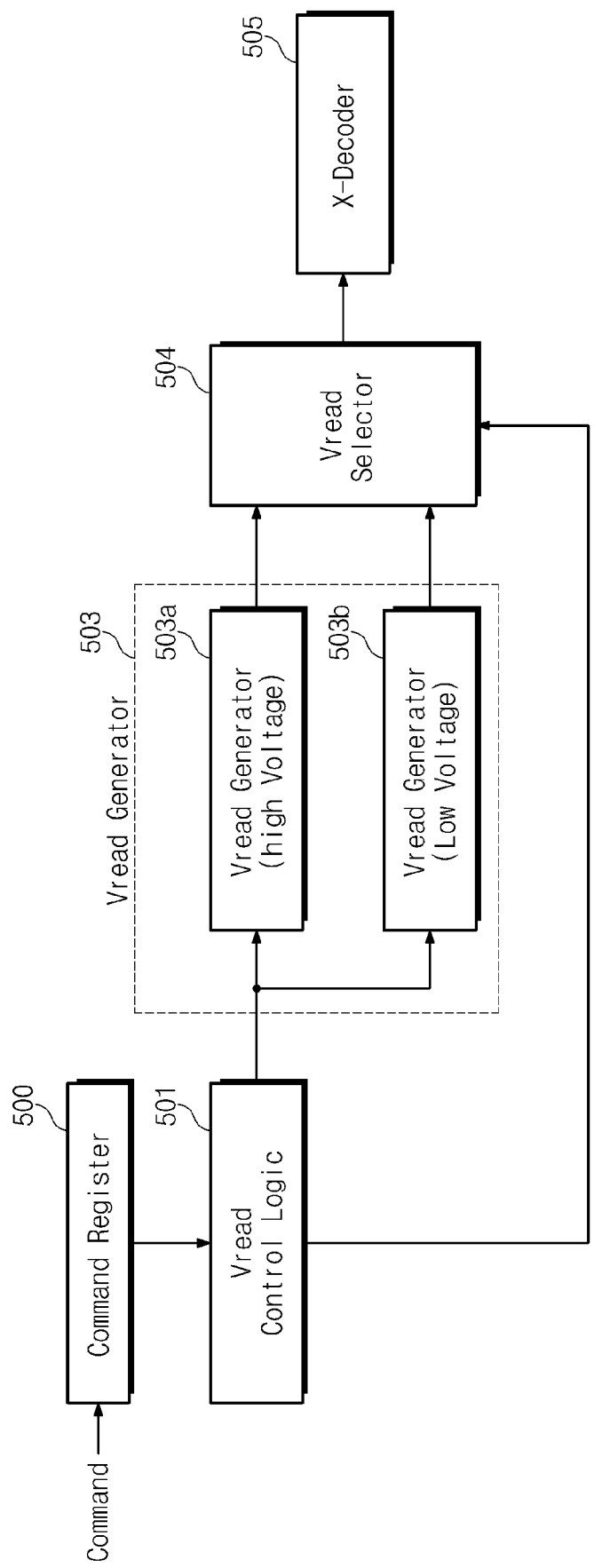
FIGS. 5, 6 and 7 are block diagrams for describing a non-volatile memory devices according to embodiments of the present invention.

FIG. 5 illustrates such another embodiment of the present invention. Here, a command register 500 receives a command which specifies the use of either Vread-high or Vread-low during a read or read verify operation. The command register 500 issues a correspond control signal to Vread control logic 501, and the Vread control logic 501 activates a read generator 503 which includes a Vread-high voltage generator 503a and a Vread-low voltage generator 503b. As their names suggest, the Vread-high voltage generator 503a generates a relatively high read voltage (Vread-high), and the Vread-low voltage generator generates 503b generates a relatively low read voltage (Vread-low). The thus generated Vread-high and Vread-low are applied to a Vread selector 504. The Vread control logic 501 is programmed to control the Vread selector 504 to output one of Vread-high and V-read low according to the command received from the command register 500. In this manner, either Vread-high or Vread-low is supplied to an X-decoder circuit 505, which in turn applies Vread-high or Vread-low to non-selected word lines of the addressed memory block.

Figure 6:
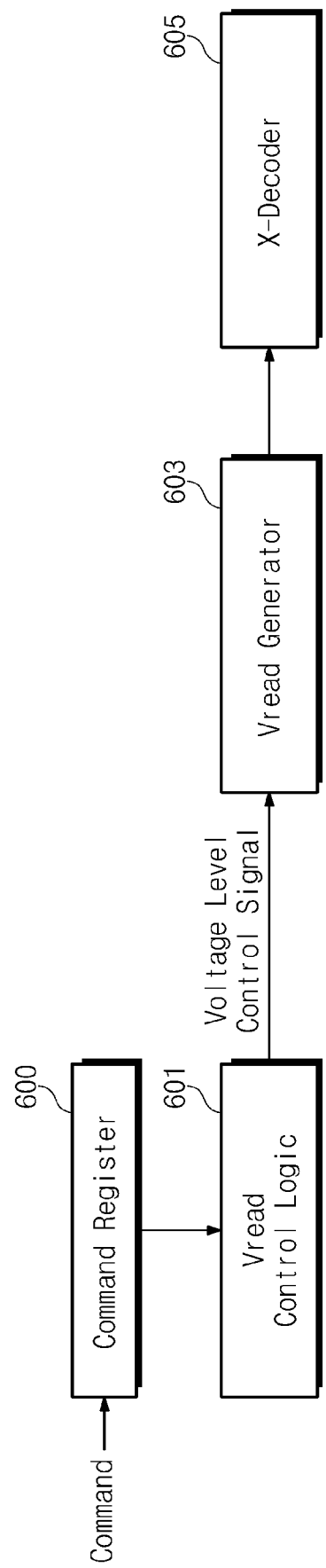

FIG. 6 illustrates another example in which a command is utilized to selectively generate Vread-high and Vread-low. Here, a Vread control logic 601 is responsive to a command register 600 to generate a voltage level control signal. A Vread generator 603 is responsive to the voltage level control signal to generate either a voltage Vread-high or a voltage Vread-low, and the thus generated voltage is applied to an X-decoder 605. As such, according to the command received by the command register 600, either Vread-high or Vread-low is supplied to the X-decoder circuit 605, which in turn applies Vread-low to non-selected word lines of the addressed memory block.

Figure 7:
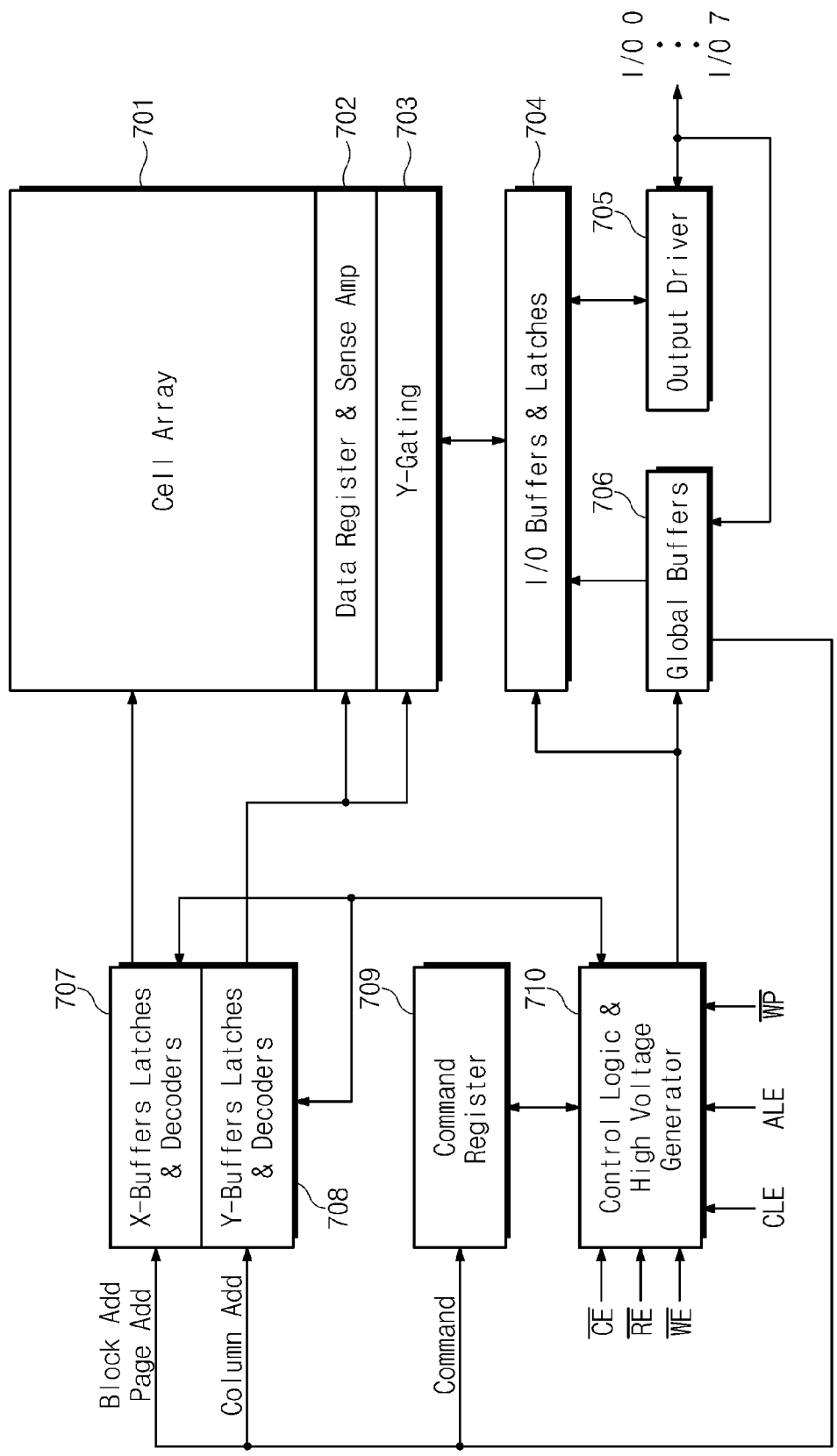

FIG. 7 illustrates a more detailed block diagram of a memory device according to an embodiment of the present invention. As shown, the memory device of this example includes a memory cell array 701, a data register & sense amplifier circuit 702, a Y-gating circuit 703, input/output (I/O) buffers and latches 704 (herein below "I/O buffer 704"), an output driver 705, global buffers 706, X-buffers, latches and decoders 707 (herein below "X-decoder 707"), Y-buffers, latches and decoders 708 (herein below "Y-decoder 708"), a command register 709, and control logic and high voltage generator 710.

The memory cell array 701 includes blocks of m-bit non-volatile memory cells and blocks of n-bit non-volatile memory cells, where $1 \leq m < n$. For example, the m-bit non-volatile memory cells may be SLC memory cells (m=1), and the n-bit non-volatile memory cells may be MLC memory cells (n=2 or more). Further, the memory cells may be NAND flash memory cells such as those generally depicted in FIGS. 1 and 1A.

The Y-decoder is responsive to column addresses to control the data register and sense amplifier 702 and the Y-gating circuit 703. Generally, the data register and sense amplifier 702 is made up of circuitry utilized, for example, to temporarily input data and sense output data during write and read operations, and the Y-gating circuit 703 controls access to addressed bit lines (columns) of the memory cell array 701.

The X-decoder 707 is responsive to block and page addresses to apply control voltages to selected and non-selected word lines (rows) of the memory cell array 701. For example, in a read or read verify operation, the X-decoder 707 applies Vread-high or Vread-low to non-selected word lines of an addressed block of the memory cell array 701.

The I/O buffers and latches 704, global buffers 706 and output driver 705 function in a well-known manner to transmitted and receive data, addresses and commands via external circuits, such as the illustrated input/output ports I/O 0:7.

The control logic and high voltage generator 710 is responsive to commands received via the command register 709 to control an overall operation of the memory device, namely, to control read, read verify and write operations. These operations are well-understood by those skilled in the art, and a detailed description thereof is omitted here for brevity.

The control logic and high voltage generator 710 may, for example, include components such as those illustrated in previously described FIG. 5 or FIG. 6. In the case of FIG. 5, as described above, the Vread control logic 501 activates the read generator 503 which includes the Vread-high voltage generator 503a and the Vread-low voltage generator 503b. The Vread-high voltage generator 503a generates the high read voltage (Vread-high), and the Vread-low voltage generator generates 503b generates the low read voltage (Vread-low). The Vread control logic 501 is programmed to control the Vread selector 504 to output one of Vread-high and V-read low according to the command of the command register 500. In particular, if the command is directed to n-bit memory cells (e.g., MLC memory cells), then the Vread control logic 501 controls the Vread selector 504 to output Vread-high. In this manner, Vread-high is supplied to an X-decoder 707 (FIG. 7), which in turn applies Vread-high to non-selected word lines of the addressed memory block of the memory cell array 701 (FIG. 7). In contrast, if the command is directed to m-bit memory cells (e.g., SLC memory cells), then the Vread control logic 501 controls the Vread selector 504 to output Vread-low. As such, Vread-low is supplied to an X-decoder 707 (FIG. 7), which in turn applies Vread-low to non-selected word lines of the addressed memory block of the memory cell array 701 (FIG. 7).

In the case where the configuration of FIG. 6 is implemented within the control logic and high voltage generator 710 (FIG. 7), the Vread control logic 601 is responsive to the command register 600 to generate the voltage level control signal to control the Vread generator 603 to generate either the voltage Vread-high or the voltage Vread-low, and the thus generated voltage is applied to an X-decoder 707 (FIG. 7). For example, if the command is directed n-bit memory cells (e.g., MLC memory cells), then the Vread control logic 601 controls the Vread generator 602 to output Vread-high. In this manner, Vread-high is supplied to an X-decoder circuit 707 (FIG. 7), which in turn applies Vread-high to non-selected word lines of the addressed memory block of the memory cell array 407 (FIG. 7). In contrast, if the command is directed to m-bit memory cells (e.g., SLC memory cells), then the Vread control logic 601 controls the Vread generator 603 to output Vread-low. As such, Vread-low is supplied to the X-decoder circuit 707 (FIG. 7), which in turn applies Vread-low to non-selected word lines of the addressed memory block of the memory cell array 701 (FIG. 7).

Figure 8:
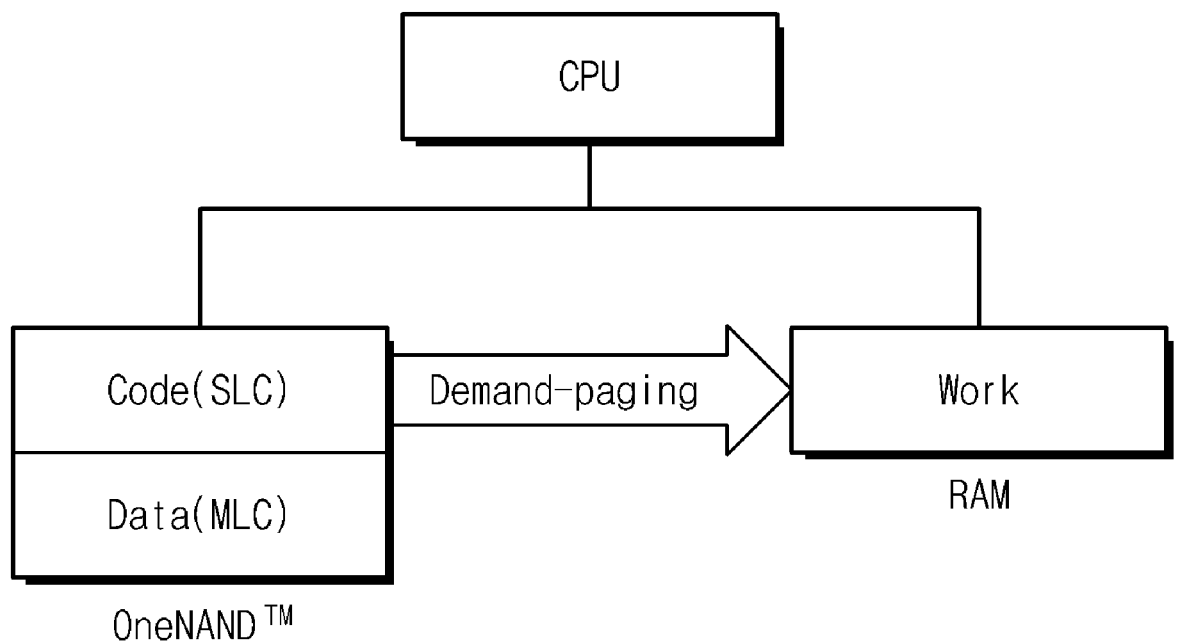
FIG. 8 is a block diagram of a memory system according to embodiments of the present invention.

The embodiments as described above can be implemented in a variety of electronic memory applications. FIG. 8 illustrates an example in which one or more of the above embodiments is implemented in a system including OneNAND™ memory with SLC/MCL NAND flash memory. In this example, the SLC memory blocks (having a relatively fast access time) are utilized to stored code, while the MLC memory blocks (having a relatively slow access time) are utilized to store data. Under control of a CPU (central processing unit), demand-paging is utilized to transfer data from the OneNAND™ memory to a working memory (RAM). This architecture may be especially useful for mobile applications.

Figure 9:
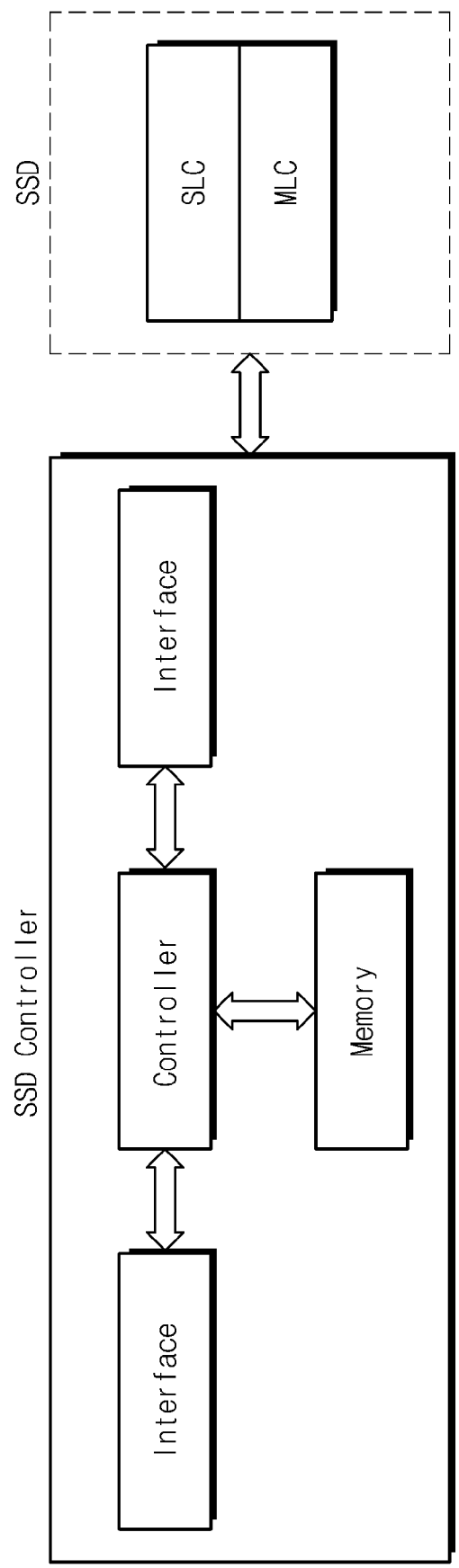
FIG. 9 is a block diagram of a solid-state drive (SSD) system according to an embodiment of the present invention.

FIG. 9 illustrates an example in which one or more of the above embodiments is implemented in a solid state drive (SSD) system according to an embodiment of the present invention. As shown, the SSD of this example includes an SSD controller and non-volatile storage media (SSD).

The SSD controller includes first and second interfaces, a controller, and a memory.

The first interface functions as a data I/O interface with a host device, such as a host central processing unit (CPU) (not shown). Non-limiting examples of the first interface include Universal Serial Bus (USB) interfaces, Advanced Technology Attachment (ATA) interfaces, Serial ATA (SATA) interfaces, Small Computer System Interface (SCSI) interfaces.

The second interface functions as a data I/O interface with the non-volatile storage media (SSD). In particular, the second interface is utilized to transmit/receive various commands, addresses and data to/from the non-volatile storage media. As will be apparent to those skilled in the art, a variety of different structures and configurations of the second interface are possible, and thus a detailed description thereof is omitted here for brevity.

The controller and memory are operatively connected between the first and second interfaces, and together function to control/manage the flow of data between the host device (not shown) and the non-volatile storage media. The memory may, for example, be a DRAM type of memory device, and the controller may, for example, include a central processing unit (CPU), a direct memory access (DMA) controller, and an error correction control (ECC) engine. The operations generally executed by controller (and memory) to transfer data between the host device (not shown) and SSD memory banks are understood by those skilled in the art, and thus a detailed description thereof is omitted here for brevity.

Still referring to FIG. 9, the non-volatile storage media of this example includes a high-speed non-volatile memory (SLC) and a low-speed non-volatile memory (MLC). As the names suggest, the high-speed NVM (SLC) is capable of operating at a relatively higher speed (e.g., random write speed) when compared to the low-speed NVM (MLC). In an exemplary embodiment, the high-speed NVM is single-level cell (SLC) flash memory, and the low-speed NVM is multi-level cell (MLC) flash memory. However, the embodiment is not limited in this respect.

Generally, the high-speed NVM (SLC) is utilized to store frequently accessed (written) data such as metadata, and the low-speed NVM (MLC) is utilized to store less frequently accessed (written) data such as media data. Also, due to the nature of the respective data being stored, the storage capacity of the low-speed NVM (MLC) will typically be much higher than that of the high-speed NVM (SCL).

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A non-volatile memory comprising:
    a plurality of m-bit non-volatile memory cells and a plurality of n-bit non-volatile memory cells, where $1 \leq m < n$; and
    a voltage generator which generates a first read voltage applied to non-selected m-bit non-volatile memory cells and a second read voltage applied to non-selected n-bit non-volatile memory cells, wherein the first read voltage is less than the second read voltage.

2. The non-volatile memory of claim 1, wherein the m-bit non-volatile memory cells are single-level flash memory cells, and the n-bit non-volatile memory cells are multi-level flash memory cells.

3. The non-volatile memory of claim 2, wherein the single-level flash memory cells and multi-level flash memory cells are NAND flash memory cells.

4. The non-volatile memory of claim 1, wherein the m-bit flash memory cells are arranged in a plurality of first memory blocks, and the n-bit non-volatile memory cells are arranged in a plurality of second memory blocks.

5. The non-volatile memory of claim 4, further comprising:
    a block address decoder which decodes a block address from an input read address;
    a read voltage selector which is responsive to the block address decoder to cause the voltage generator to generate the first read voltage or the second read voltage;
    a row decoder which is responsive to the block address decoder to apply the first read voltage or the second read voltage generated by voltage generator to at least one of the first or second memory blocks corresponding to the block address.

6. The non-volatile memory of claim 4, further comprising:
    a block address decoder which decodes a block address from an input read address;
    a read voltage selector which is responsive to the block address decoder to select either the first read voltage or the second read voltage generated by the voltage generator;
    a row decoder which is responsive to the block address decoder to apply the first read voltage or the second read voltage selected by the read voltage selector to at least one of the first or second memory blocks corresponding to the block address.

7. The non-volatile memory of claim 4, further comprising:
    a read voltage selector which is responsive to a read command to cause the voltage generator to generate the first read voltage or the second read voltage;
    a row decoder which applies the first read voltage or the second read voltage generated by voltage generator to at least one of the first or second memory blocks.

8. The non-volatile memory of claim 4, further comprising:
    a read voltage selector which is responsive to read command to select either the first read voltage or the second read voltage generated by the voltage generator;
    a row decoder which applies the first read voltage or the second read voltage selected by the read voltage selector to at least one of the first or second memory blocks.

9. A solid state drive (SSD) comprising a SSD controller and an SSD memory, wherein the SSD memory comprises a plurality of m-bit non-volatile memory cells and a plurality of n-bit non-volatile memory cells, where $1 \leq m < n$, and a voltage generator which generates a first read voltage applied to non-selected m-bit non-volatile memory cells and a second read voltage applied to non-selected n-bit non-volatile memory cells, wherein the first read voltage is less than the second read voltage.

10. The non-volatile memory of claim 9, wherein the m-bit non-volatile memory cells are single-level flash memory cells, and the n-bit non-volatile memory cells are multi-level flash memory cells.

11. The non-volatile memory of claim 9, wherein the m-bit flash memory cells are arranged in a plurality of first memory blocks, and the n-bit non-volatile memory cells are arranged in a plurality of second memory blocks.

12. A computer system comprising a central processing unit, a working memory, and a non-volatile memory, wherein the non-volatile memory comprises a plurality of m-bit non-volatile memory cells and a plurality of n-bit non-volatile memory cells, where $1 \leq m < n$, and a voltage generator which generates a first read voltage applied to non-selected m-bit non-volatile memory cells and a second read voltage applied to non-selected n-bit non-volatile memory cells, wherein the first read voltage is less than the second read voltage.

13. The non-volatile memory of claim 12, wherein the m-bit non-volatile memory cells are single-level flash memory cells, and the n-bit non-volatile memory cells are multi-level flash memory cells.

14. The non-volatile memory of claim 12, wherein the m-bit flash memory cells are arranged in a plurality of first memory blocks, and the n-bit non-volatile memory cells are arranged in a plurality of second memory blocks.

15. A method of operating a non-volatile memory comprising applying a first read voltage to non-selected m-bit non-volatile memory cells of the non-volatile memory and a second read voltage to non-selected n-bit non-volatile memory cells of the non-volatile memory, wherein where $1 \leq m < n$, and the first read voltage is less than the second read voltage.

16. The method of claim 15, further comprising selectively generating the first and second read voltages according to a decoded block address.

17. The method of claim 15, further comprising selectively generating the first and second read voltages according to a read command.

18. The method of claim 15, wherein the m-bit non-volatile memory cells are single-level flash memory cells, and the n-bit non-volatile memory cells are multi-bit flash memory cells.

19. The method of claim 15, wherein the non-volatile memory is a NAND flash memory device.

20. The method of claim 15, wherein the non-volatile memory is a solid state drive (SSD).

* * * * *